US011475952B2

(12) United States Patent
Huang et al.

(10) Patent No.: US 11,475,952 B2
(45) Date of Patent: Oct. 18, 2022

(54) TERNARY CONTENT ADDRESSABLE MEMORY AND TWO-PORT STATIC RANDOM ACCESS MEMORY

(71) Applicant: UNITED MICROELECTRONICS CORP., Hsin-Chu (TW)

(72) Inventors: Chun-Hsien Huang, Tainan (TW); Yu-Tse Kuo, Tainan (TW); Shu-Ru Wang, Taichung (TW); Chun-Yen Tseng, Tainan (TW); Chun-Chieh Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 37 days.

(21) Appl. No.: 17/179,418

(22) Filed: Feb. 19, 2021

(65) Prior Publication Data
US 2022/0238158 A1 Jul. 28, 2022

(30) Foreign Application Priority Data
Jan. 25, 2021 (CN) .......................... 202110095452.2

(51) Int. Cl.
*G11C 15/04* (2006.01)
(52) U.S. Cl.
CPC .................................. *G11C 15/04* (2013.01)
(58) Field of Classification Search
CPC ..................................................... G11C 15/04
USPC ...................................................... 365/49.11
See application file for complete search history.

(56) References Cited

U.S. PATENT DOCUMENTS

2007/0008760 A1\* 1/2007 Nii .......................... G11C 15/04
365/233.1

OTHER PUBLICATIONS

K. Nii et al., "Silicon measurements of characteristics for passgate/pull-down/pull-up MOSs and search MOS in a 28 nm HKMG TCAM bitcell," Proceedings of the 2015 International Conference on Microelectronic Test Structures, Tempe, AZ, 2015, pp. 200-203, doi: 10.1109/ICMTS.2015.7106140.
R. O. Topaloglu, "Standard Cell and Custom Circuit Optimization using Dummy Diffusions through STI Width Stress Effect Utilization," 2007 IEEE Custom Integrated Circuits Conference, San Jose, CA, 2007, pp. 619-622, doi: 10.1109/CICC.2007.4405808.

\* cited by examiner

*Primary Examiner* — Connie C Yoha
(74) *Attorney, Agent, or Firm* — Winston Hsu

(57) ABSTRACT

A ternary content addressable memory and a two-port SRAM are provided and include a storage cell and two transistors. The storage cell includes a first active region, a second active region, a third active region, and a fourth active region, extending along a first direction, and a first gate line, a second gate line, a third gate line, and a fourth gate line extending along a second direction. The first gate line crosses the third active region and the fourth active region, the second gate line crosses the fourth active region, the third gate line crosses the first active region, and the fourth gate line crosses the first active region and the second active region. The transistors are electrically connected to the storage cell, and the transistors and the storage cell are arranged along the first direction.

20 Claims, 9 Drawing Sheets

TERNARY CONTENT ADDRESSABLE MEMORY AND TWO-PORT STATIC RANDOM ACCESS MEMORY

CROSS REFERENCE TO RELATED APPLICATION

This application claims the benefit of Chinese Patent Application Serial No. 202110095452.2, filed Jan. 25, 2021, and the entire contents of which are incorporated herein by reference.

BACKGROUND OF THE INVENTION

1. Field of the Invention

The present invention relates to a ternary content addressable memory (TCAM) and a two-port static random access memory (SRAM), and particularly to a TCAM and a two-port SRAM with eight transistors as a cell structure.

2. Description of the Prior Art

In traditional array structures of memories, a six-transistor static-random access memory (6T-SRAM) cell is commonly used as a bit cell structure. With improvement of memory performance, the bit cell structure of the memory further includes two transistors. However, the installation of these two transistors causes original symmetrical layout structure to lose symmetry, resulting in different transistor characteristics in the bit cell structure of the memory, which in turn affects the performance of the memory. For example, in the traditional bit cell structure of the memory, these two transistors will be disposed on one of sides of the 6T-SRAM arranged along an extending direction of a gate line, and in order to avoid a pull-down (PD) transistor and a pass-gate (PG) transistor being affected by these two transistors, a width of a shallow trench isolation (STI) between these two transistors and the pull-down transistor is greater than a width of the STI located on a side of 6T-SRAM opposite to these two transistors. Due to different length of diffusion (LOD) effect (also called STI stress effect), two pull-down transistors adjacent to the STI on both sides of the 6T-SRAM will have different transistor characteristics, and two pass-gate transistors also have different transistor characteristics, such as have different threshold voltages, resulting in poor read operation and high bit error rate (BER) of the memory.

SUMMARY OF THE INVENTION

According to an embodiment of the present invention, a ternary content addressable memory (TCAM) is provided and includes a storage cell and two search transistors. The storage cell includes a first active region, a second active region, a third active region, a fourth active region, a first gate line, a second gate line, a third gate line, and a fourth gate line. The first active region, the second active region, the third active region, and the fourth active region extend along a first direction and sequentially arranged along a second direction. The first gate line crosses the third active region and the fourth active region and extends along the second direction. The second gate line crosses the fourth active region and extends along the second direction. The third gate line crosses the first active region and extends along the second direction. The fourth gate line crosses the first active region and the second active region and extends along the second direction. The search transistors are electrically connected to the storage cell, and the search transistors and the storage cell are arranged along the first direction.

According to another embodiment of the present invention, a two-port static random access memory (SRAM) is provided and includes a storage cell and two read-port transistors. The storage cell includes a first active region, a second active region, a third active region, a fourth active region, a first gate line, a second gate line, a third gate line, and a fourth gate line. The first active region, the second active region, the third active region, and the fourth active region extend along a first direction and sequentially arranged along a second direction. The first gate line crosses the third active region and the fourth active region and extends along the second direction. The second gate line crosses the fourth active region and extends along the second direction. The third gate line crosses the first active region and extends along the second direction. The fourth gate line crosses the first active region and the second active region and extends along the second direction. The read-port transistors are electrically connected to the storage cell, and the read-port transistors and the storage cell are arranged along the first direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
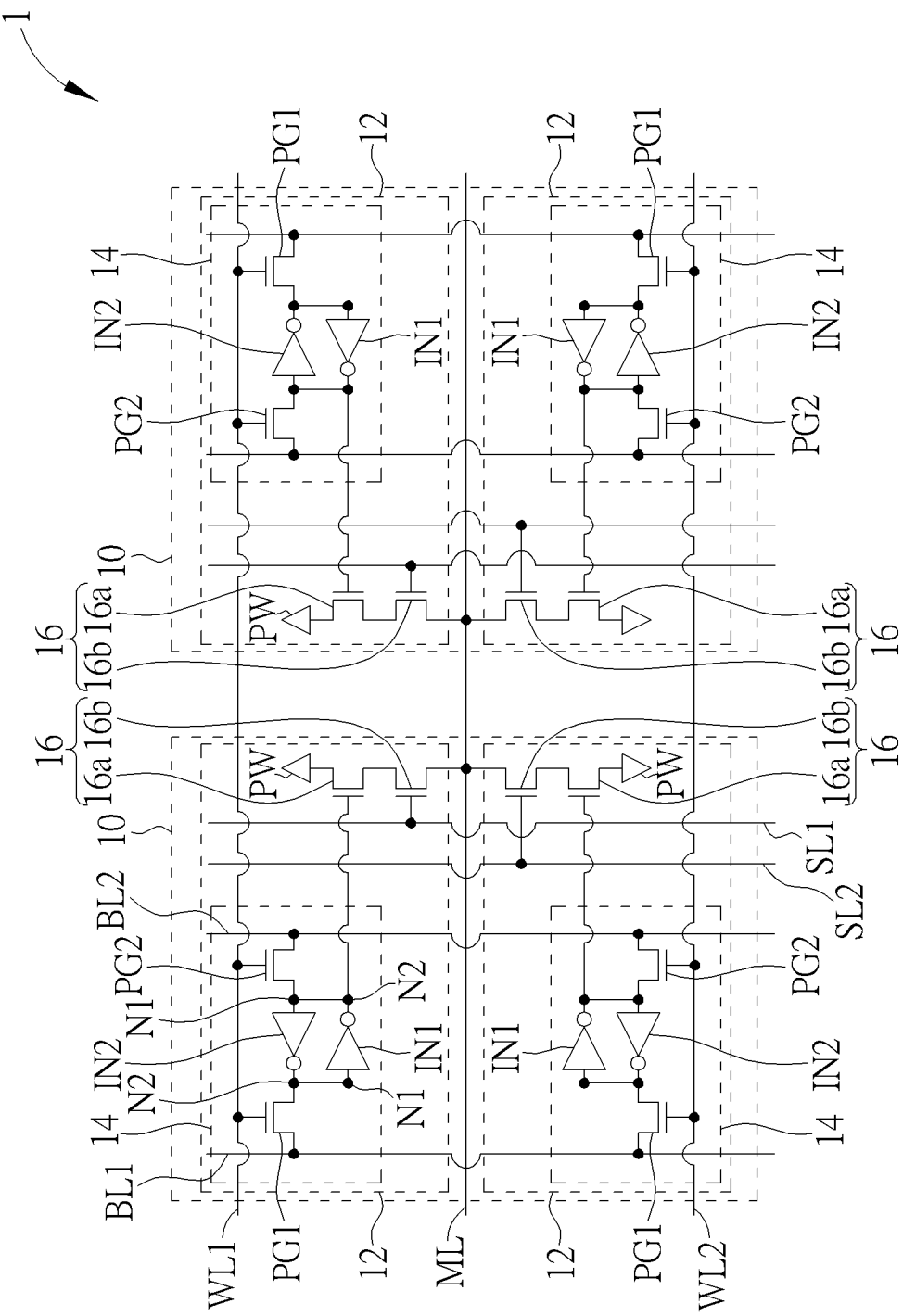
FIG. 1 schematically illustrates a circuit diagram of a ternary content addressable memory (TCAM) according to an embodiment of the present invention.

To provide a better understanding of the present invention to the persons skilled in the art of the present invention, embodiments of the present invention are illustrated in the accompanying drawings to elaborate on the contents and effects to be achieved. It is noted that, the following drawings may be simplified schematic diagrams, and elements therein may not be drawn to scale. The numbers and dimensions of the elements in the drawings are just illustrative, and are not intended to limit the scope of the present invention.

Refer to FIG. 1, which schematically illustrates a circuit diagram of a ternary content addressable memory (TCAM) according to an embodiment of the present invention. As shown in FIG. 1, TCAM 1 may include a plurality of TCAM bit cells 10, a plurality of bit lines BL1, BL2, a plurality of word lines WL1, WL2, a plurality of search lines SL1, SL2, and a plurality of match lines ML, and each TCAM bit cell 10 may be electrically connected to corresponding bit lines BL1, BL2, corresponding word lines WL1, WL2, corresponding search lines SL1, SL2, and one corresponding match line ML. For clarity, FIG. 1 shows two adjacent TCAM bit cells 10 and the corresponding bit lines BL1, BL2, word lines WL1, WL2, search lines SL1, SL2 and match line ML, but not limited to this. Since each TCAM bit cell 10 may have same electrical connection, single one TCAM bit cell 10 is taken as an example for description below, but not limited to thereto.

In the embodiment of FIG. 1, each TCAM bit cell 10 may include two basic units 12, and each basic unit 12 may include a storage cell 14 and a search transistor group 16, in which each storage cell 14 may include a first inverter IN1, a second inverter IN2, a first pass-gate transistor PG1 and a second pass-gate transistor PG2. In each storage cell 14, the first inverter IN1 and the second inverter IN2 may respectively have a first terminal N1 and a second terminal N2, for example, an input terminal and an output terminal, respectively. The first terminal N1 of the first inverter IN1 may be electrically connected to a drain/source of the first pass-gate transistor PG1 and the second terminal N2 of the second inverter IN2, and the first terminal N1 of the second inverter IN2 may be electrically connected to a drain/source of the second pass-gate transistor PG2 and the second terminal N2 of the first inverter IN1. Although not shown in FIG. 1, each of the first inverter IN1 and the second inverter IN2 may include a pull-up (PU) transistor and a pull-down (PD) transistor. In each inverter, gates of the pull-up transistor and the pull-down transistor are electrically connected to each other and serve as the second terminal N2, a drain/source of the pull-up transistor and a drain/source of the pull-down transistor are electrically connected to each other and serve as the first terminal N1, a source/drain of the pull-up transistor and a source/drain of the pull-down transistor are electrically connected to the first voltage source and the second voltage source PW, respectively, and a voltage provided by the first voltage source may be greater than that of the second voltage source PW. In other words, the storage cell 14 may include, for example, a 6T-SRAM cell.

As shown in FIG. 1, in one TCAM bit cell 10, source/drains of the first pass-gate transistors PG1 of the basic units 12 may be electrically connected to the same bit line BL1, and source/drains of the second pass-gate transistors PG2 of the basic units 12 may be electrically connected to the same bit line BL2, and gates of the first pass-gate transistor PG1 and the second pass-gate transistor PG2 of one basic unit 12 and the gates of the first pass-gate transistor PG1 and second pass-gate transistor PG2 of another basic unit 12 are electrically connected to two different word lines WL1, WL2, respectively.

As shown in FIG. 1, each search transistor group 16 may include a first search transistor 16a and a second search transistor 16b. A gate, a drain/source, and a source/drain of the first search transistor 16a may be electrically connected to the second terminal N2 of the first inverter IN1, the second voltage source PW, and a drain/source of the second search transistor 16b, respectively, and a source/drain of the second search transistor 16b may be electrically connected to the corresponding match line ML. In one TCAM bit cell 10, the gates of the second search transistors 16b of two different basic units 12 may be electrically connected to two different search lines SL1 and SL2, respectively.

Figure 2:
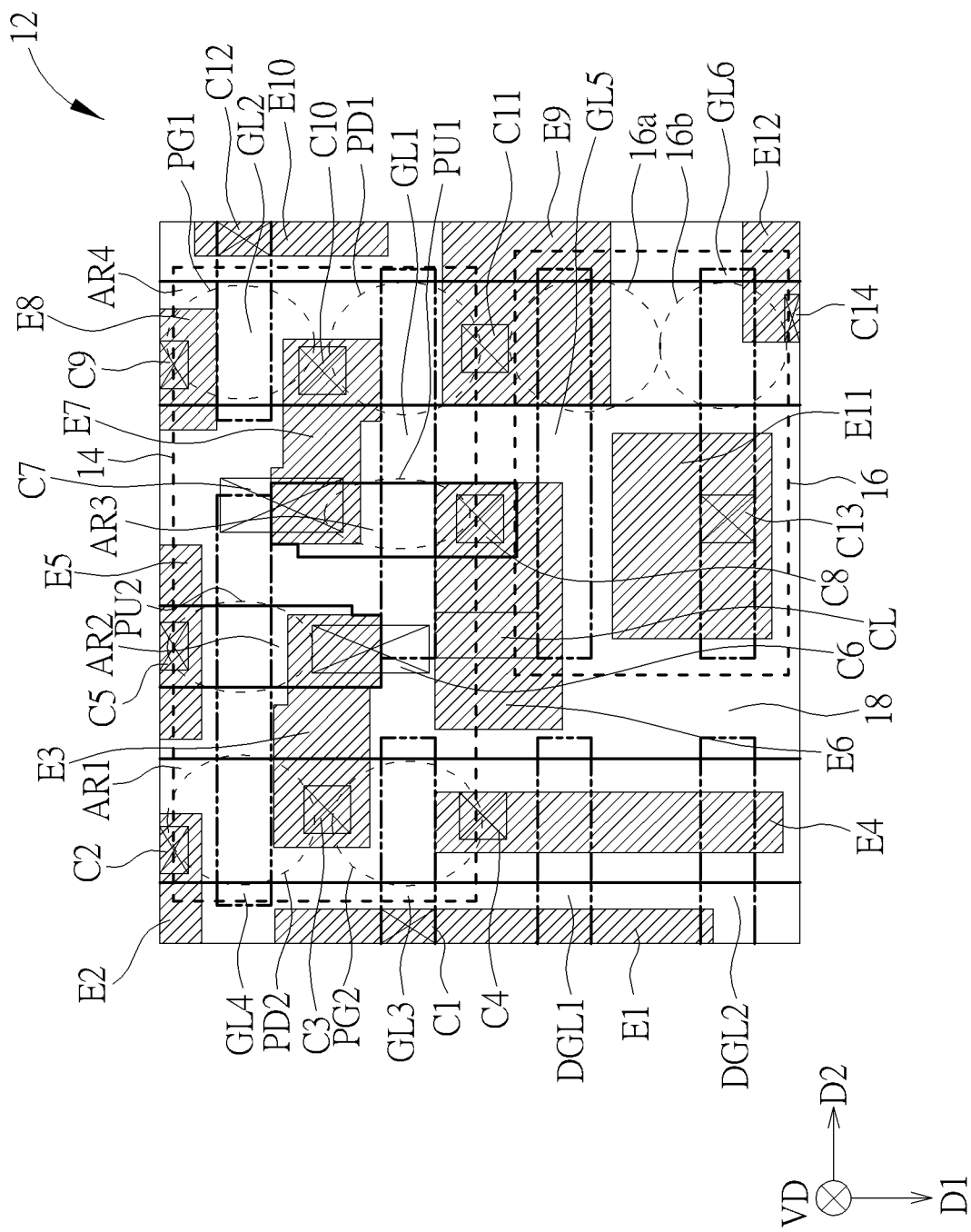
FIG. 2 schematically illustrates a top view of a layout structure of a single basic unit according to an embodiment of the present invention.

Refer to FIG. 2, which schematically illustrates a top view of a layout structure of a single basic unit according to an embodiment of the present invention. As shown in FIG. 2, the storage cell 14 of the basic unit 12 may include a first active region AR1, a second active region AR2, a third active region AR3, a fourth active region AR4, a first gate line GL1, and a second gate line GL2, a third gate line GL3, and a fourth gate line GL4. The first active region AR1, the second active region AR2, the third active region AR3, and the fourth active region AR4 may extend along the first direction D1 and are sequentially arranged along the second direction D2. The first active region AR1 and the fourth active region AR4 are mirror-symmetrical to each other with respect to the first direction D1, and the second active region AR2 and the third active region AR3 are symmetrical to each other with respect to a center of the storage cell 14. The first active region AR1, the second active region AR2, the third active region AR3, and the fourth active region AR4 may be surrounded by, for example, an insulating layer 18 and may be electrically insulated by the insulating layer 18. The insulating layer 18 may, for example, include a shallow trench isolation (STI).

For example, each of the first active region AR1, the second active region AR2, the third active region AR3, and the fourth active region AR4 may include a long fin-shaped structure extending and protruding from a semiconductor substrate or be a doped region in the semiconductor substrate. When the first active region AR1, the second active region AR2, the third active region AR3, and the fourth active region AR4 include the fin-shaped structures, the transistors formed by the first, second, third, and fourth active regions AR1, AR2, AR3, AR4 may be fin field-effect transistor (FINFET), but are not limited thereto. In some embodiments, depending on type of the transistors to be formed, the fin structure may, for example, include a semiconductor substrate material doped with n-type dopants or p-type dopants. For example, the semiconductor substrate material may include silicon, germanium, IV-IV compound semiconductor such as silicon carbide or silicon germanium, III-V semiconductor such as GaAs, GaP, GaN, InP, InAs, InSb, GaAsP, AlGaN, AlInAs, AlGaAs, GaInAs, GaInP and/or GaInAsP, or a combination thereof. In this embodiment, the first active region AR1 and the fourth active region AR4 may have a first conductivity type, and the second active region AR2 and the third active region AR3 may have a second conductivity type different from the first conductivity type. For example, the first conductivity type and the second conductivity type may be p-type and n-type, respectively, but are not limited thereto.

As shown in FIG. 2, the first gate line GL1, the second gate line GL2, the third gate line GL3, and the fourth gate line GL4 may extend along the second direction D2. As viewed along the top view direction VD, the first gate line GL1 may cross the third active region AR3 and the fourth active region AR4, so that the first gate line GL1 crossing the fourth active region AR4 may form a gate of a first pull-down transistor PD1 of the first inverter IN1, and a source/drain and a drain/source of the first pull-down transistor PD1 of the first inverter IN1 are respectively disposed in the fourth active region AR4 on both sides of the first gate line GL1. The first gate line GL1 crossing the third active region AR3 may form a gate of a first pull-up transistor PU1 of the first inverter IN1, and a source/drain and a drain/source of the first pull-up transistor PU1 are respectively disposed in the third active region AR3 on both sides of the first gate line GL1. As viewed along the top view direction VD, the second gate line GL2 may cross the fourth active region AR4, so that the second gate line GL2 crossing the fourth active region AR4 may form the gate of the first pass-gate transistor PG1, and the source/drain and the drain/source of the first pass-gate transistor PG1 are respectively disposed in the fourth active region AR4 on both sides of the second gate line GL2. In this embodiment, the drain/source of the first pass-gate transistor PG1 and the drain/source of the first pull-down transistor PD1 of the first inverter IN1 may be formed of the same doped region disposed in the fourth active region AR4, but not limited thereto. As viewed along the top view direction VD, the third gate line GL3 may cross the first active region AR1, so that the third gate line GL3 crossing the first active region AR1 may form the gate of the second pass-gate transistor PG2, and the source/drain and the drain/source of the second pass-gate transistor PG2 are respectively disposed in the first active region AR1 on both sides of the third gate line GL3. As viewed along the top view direction VD, the fourth gate line GL4 may cross the first active region AR1 and the second active region AR2, so that the fourth gate line GL4 crossing the first active region AR1 may form a gate of a second pull-down transistor PD2 of the second inverter IN2, and a source/drain and a drain/source of the second pull-down transistor PD2 of the second inverter IN2 are respectively disposed in the first active region AR1 on both sides of the fourth gate line GL4. The fourth gate line GL4 crossing the second active region AR2 may form a gate of a second pull-up transistor PU2 of the second inverter IN2, and a source/drain and a drain/source of the second pull-up transistor PU2 are respectively disposed in the second active region AR2 on both sides of the fourth gate line GL4. In this embodiment, the drain/source of the second pass-gate transistor PG2 and the drain/source of the first pull-down transistor PD1 of the second inverter IN1 may be formed of the same doped region disposed in the first active region AR1 but not limited to this. For example, the first pull-up transistor PU1 and the second pull-up transistor PU2 may be p-type field-effect transistors (pFET), such as PMOSFET, and the first pull-down transistor PD1 and the second pull-down transistor PD2, the first pass-gate transistor PG1, and the second pass-gate transistor PG2 may be n-type field effect transistors (nFETs), such as nMOSFETs.

As shown in FIG. 2, the third gate line GL3 and the fourth gate line GL4 may be respectively symmetrical to the second gate line GL2 and the first gate line GL1 with respect to the center of the storage cell 14, so that a layout structure of the first pull-up transistor PU1 and the first pull-down transistor PD1 of the first inverter IN1 may be symmetrical to a layout structure of the second pull-up transistor PU2 and the second pull-down transistor PD2 of the second inverter IN2 with respect to the center of the storage cell 14, and a layout structure of the first pass-gate transistor PG1 may be symmetrical to a layout structure of the second pass-gate transistor PG2 with respect to the center of the storage cell 14. In some embodiments, the first gate line GL1 and the fourth gate line GL4 may have the same length in the second direction D2.

In the embodiment of FIG. 2, the first search transistor 16a of the basic unit 12 may further include a fifth gate line GL5, and when viewed along the top view direction VD, the fifth gate line GL5 may extend along the second direction D2 and cross the fourth active region AR4, such that the fifth gate line GL5 crossing the fourth active region AR4 may serve as the gate of the first search transistor 16a, and the source/drain and drain/source of the first search transistor 16a may be respectively disposed in the fourth active region AR4 on both sides of the fifth gate line GL5. The fifth gate line GL5 may be disposed adjacent to the first gate line GL1, and the source/drain of the first search transistor 16a and the source/drain of the first pull-down transistor PD1 of the first inverter IN1 may be formed of the same doped region in the fourth active region AR4, such that they may be electrically connected to each other, but not limited thereto.

As shown in FIG. 2, the fifth gate line GL5 may be electrically connected to the first gate line GL1. In this embodiment, the TCAM 1 may further include a connection line CL connected between the first gate line GL1 and the fifth gate line GL5 and used to electrically connect the first gate line GL1 to the fifth gate line GL5. For example, the connection line CL may be connected to the first gate line GL1 and the fifth gate line GL5 to form a monolithic C-shaped gate structure, but is not limited to this. In some embodiments, the first gate line GL1 and the fifth gate line GL5 are symmetrical to each other with respect to the second direction D2.

In the embodiment of FIG. 2, the second search transistor 16b of the basic unit 12 may include a sixth gate line GL6, and the fifth gate line GL5 may be disposed between the sixth gate line GL6 and the first gate line GL1. As viewed along the top view direction VD, the sixth gate line GL6 may extend along the second direction D2 and cross the fourth active region AR4, so that the sixth gate line GL6 crossing the fourth active region AR4 may serve as the gate of the second search transistor 16b, and the source/drain and drain/source of the second search transistor 16b are respectively disposed in the fourth active region AR4 on both sides of the sixth gate line GL6. The drain/source of the first search transistor 16a and the source/drain of the second search transistor 16b may be disposed in the same fourth active region AR4, for example, may be formed of the same doped region. In other words, in this embodiment, the source/drains and drain/sources of the first search transistor 16a, the second search transistor 16b, the first pull-down transistor PD1 of the first inverter IN1, and the first pass-gate transistor PG1 may be disposed in the same fourth active region AR4, and accordingly, the storage cell 14, the first search transistor 16a, and the second search transistor 16b may be arranged along an extending direction of the active regions (for example, the first direction D1). In the embodiment of FIG. 2, the sixth gate line GL6 may be symmetrical to the fifth gate line GL5 with respect to the second direction D2, or the sixth gate line GL6 and the fifth gate line GL5 may have the same length in the second direction D2, but not limited thereto. In some embodiments, the sixth gate line GL6 and the fifth gate line GL5 may be asymmetrical with respect to the second direction D2.

It should be noted that since the storage cell 14 and the search transistor group 16 in the same basic unit 12 may be arranged along the extending direction of the active regions (e.g., the first direction D1), a width of a portion of the insulating layer 18 located on a side of the fourth active region AR4 of the storage cell 14 opposite to the third active region AR3 in the second direction D2 may be designed to be the same as a width of another portion of the insulating layer 18 located on another side of the first active region AR1 opposite to the second active region AR2 in the second direction D2 without considering the search transistor group 16. Thus, a difference between transistor characteristics of the first pull-down transistor PD1 and the second pull-down transistor PD2 resulted from the length of diffusion (LOD) effect (also called the STI stress effect) may be mitigated, thereby improving the consistency of the transistor characteristics of the first pull-down transistor PD1 and the second pull-down transistor PD2. Similarly, the difference between transistor characteristics of the first pass-gate transistor PG1 and the second pass-gate transistor PG2 may also be reduced, and the consistency of them may be improved.

In some embodiments, as shown in FIG. 2, the basic unit 12 may optionally further include two dummy gate lines DGL1, DGL2 arranged along the first direction D1, and each of the dummy gate lines DGL1, DGL2 extends along the second direction D2 and crosses the first active region AR1. It is noted that the dummy gate line DGL1 and the fifth gate line GL5 may be arranged in a straight line extending along the second direction D2, and the dummy gate line DGL2 and the sixth gate line GL6 may be arranged along another straight line extending along the second direction D2. Through installation of the dummy gate lines DGL1, DGL2, quality of forming the gate lines may be improved in patterning process of the gate lines.

In the present invention, each of the gate lines and the connection line CL refers to a structure that includes a gate insulating layer and a gate conductive layer sequentially stacked, for example, the structure may also include spacers disposed on sidewalls of the gate conductive layer and the gate insulating layer. The gate lines and the connection line CL may include suitable conductive materials, such as polysilicon, metal silicide, or suitable metal materials. The metal material may for example include aluminum or tungsten. When the gate lines and the connection line CL are metal gate lines, the gate lines and the connection line CL may also include high-k materials and work function metals. The work function metals may include titanium nitride (TiN) for forming pFET, or titanium aluminide (TiAl) for forming nFET, but not limited thereto.

In the embodiment of FIG. 2, the basic unit 12 may further include a first contact layer and a first metal layer sequentially disposed on the gate lines and the active regions. In order to clearly illustrate the layout structure of the basic unit 12, FIG. 2 omits another insulating layer provided between the first metal layer and the gate lines and between the first metal layer and the active regions and used for electrically insulating the first metal layer from the gate lines and the active regions that are not corresponding to the first metal layer, but not limited to this. Specifically, the first contact layer may include contact plugs C1-C14 disposed in the insulating layer, and the first metal layer may include electrodes E1-E12 disposed on the insulating layer. The contact plug C1 may be disposed on the third gate line GL3, and the electrode E1 may be disposed on the contact plug C1 and used to electrically connect the third gate line GL3 to the corresponding word line (e.g., the word line WL1 shown in FIG. 1). As viewed along the top view direction VD, the electrode E1 may, for example, cross the third gate line GL3 and the dummy gate line DGL1, but is not limited thereto. The contact plugs C2-C4 may be respectively disposed on the source/drain and the drain/source of the second pull-down transistor PD2 and the source/drain of the second pass-gate transistor PG2. The electrode E2 may be disposed on the contact plug C2 and used to electrically connect the source/drain of the second pull-down transistor PD2 to a second voltage source (e.g., the second voltage source PW shown in FIG. 1). The electrode E3 may be disposed on the contact plug C3 and the contact plug C6 and used to electrically connect the drain/sources of the second pull-down transistor PD2 and the second pull-up transistor PU2. The electrode E4 is disposed on the contact plug C4 and used to electrically connect the source/drain of the second pass-gate transistor PG2 to the corresponding bit line (e.g., the bit line BL2 shown in FIG. 1). The contact plugs C5, C6 may be respectively disposed on the source/drain and drain/source of the second pull-up transistor PU2. The electrode E5 is disposed on the contact plug C5 and used to electrically connect the source/drain of the second pull-up transistor PU2 to the first voltage source. The electrode E6 may be disposed on the contact plug C8 and used to electrically connect the source/drain of the first pull-up transistor PU1 to the first voltage source. The contact plugs C7, C8 may be respectively disposed on the drain/source and source/drain of the first pull-up transistor PU1. The electrode E7 may be disposed on the contact plug C7 and the contact plug C10 and used to electrically connect the drain/sources of the first pull-down transistor PD1 and the first pull-up transistor PU1 to each other. The contact plugs C9-C11 may be respectively disposed on the source/drain of the first pass-gate transistor PG1 and the drain/source and source/drain of the second pull-down transistor PD2. The electrode E8 may be disposed on the contact plug C9 and used to electrically connect the source/drain of the first pass-gate transistor PG1 to the corresponding bit line (e.g., the bit line BL1 shown in FIG. 1). The electrode E9 may be disposed on the contact plug C11 and used to electrically connect the source/drain of the first pull-down transistor PD1 to the second voltage source (e.g., the second voltage source PW shown in FIG. 1). The contact plug C12 may be disposed on the second gate line GL2, the contact plug C13 may be disposed on the sixth gate line GL6, and the contact plug C14 may be disposed on the drain/source of the second search transistor 16b. The electrode E10 may be disposed on the contact plug C12 and used to electrically connect the second gate line GL2 to the corresponding word line (e.g., the word line WL1 shown in FIG. 1). The electrode E11 may be disposed on the contact plug C13 and used to electrically connect the gate of the second search transistor 16b to the corresponding search line (e.g., the search line SL1 shown in FIG. 1). The electrode E12 may be disposed on the contact plug C14 and used to electrically connect the drain/source of the second search transistor 16b to the corresponding match line (e.g., the match line ML shown in FIG. 1). The first contact layer may include a suitable conductive material, such as tungsten or copper. The first metal layer may include a suitable conductive material, such as aluminum, copper, or tungsten, but the present invention is not limited thereto.

Figure 3:
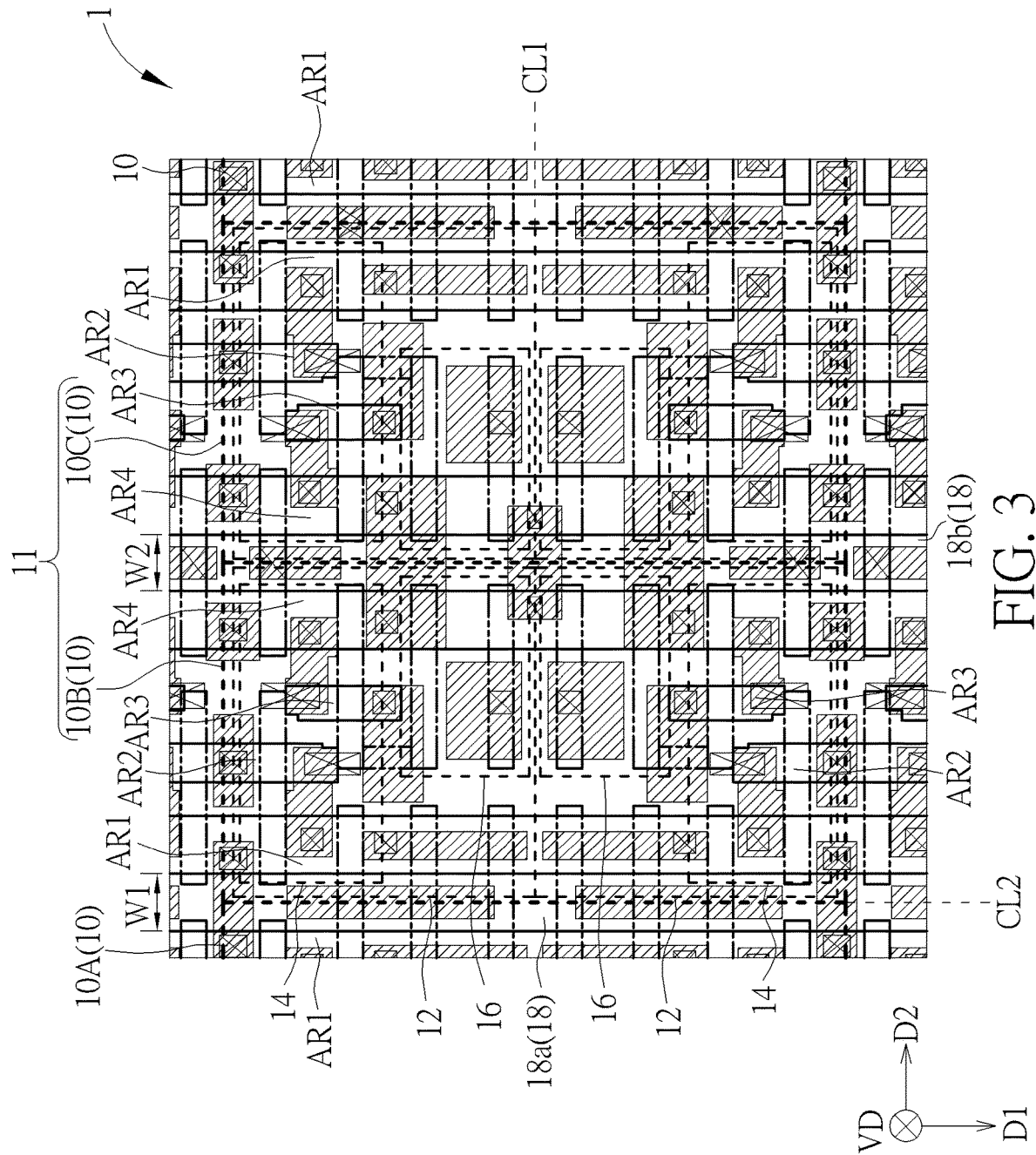
FIG. 3 schematically illustrates a top view of the active regions, gate lines, first contact layer, and first metal layer of the TCAM according to an embodiment of the present invention.

Refer to FIG. 3, which schematically illustrates a top view of the active regions, gate lines, first contact layer, and first metal layer of the TCAM according to an embodiment of the present invention. In order to clearly illustrate the structure of each TCAM bit cell 10, the basic unit 12 on an upper side of the TCAM bit cell 10B in FIG. 3 may be the same as the basic unit 12 shown in FIG. 2, so symbols corresponding to the transistors and gate lines are omitted, but not limited to this. As shown in FIG. 3, in the single TCAM bit cell 10, structures of two basic units 12 may be mirror-symmetrical with respect to the extending direction of the gate lines (e.g., the second direction D2). For example, the structures of the two basic units 12 may be symmetrical to each other with respect to a center line CL1 located between two sixth gate lines GL6 of the two basic units 12 and spaced apart from the two sixth gate lines GL6 by the same distance. Structures of two TCAM bit cells 10 adjacent to each other and arranged in the second direction D2 may be mirror-symmetrical with respect to the extending direction of the active regions (e.g., the first direction D1), such that the structure of each basic unit 12 may be obtained from the basic unit 12 shown in FIG. 2 and will not be detailed redundantly. For example, the structures of the two TCAM bit cells 10 may be symmetrical to each other with respect to a center line CL2 located between two first active regions AR1 or the two fourth active regions AR4 of the two TCAM bit cells 10 and spaced apart from the two first active regions AR1 or the two fourth active regions AR4 by the same distance. In some embodiments, as shown in FIG. 3, two adjacent TCAM bit cells 10 arranged in the second direction D2 may form a repeating structure 11, and the TCAM 1 may include a plurality of repeating structures 11, in which the repeating structures 11 may have the same structure, and the repeating structures 11 with the same orientation may be arranged in an array. In some embodiments, the structures of the two TCAM bit cells 10 adjacent to each other and arranged in the first direction D1 may be mirror-symmetrical to each other with respect to the second direction D2, but not limited to this.

In the embodiment of FIG. 3, in the same TCAM bit cell 10, the storage cells 14 are arranged along the first direction D1, and the first search transistors 16a and the second search transistors 16b of the search transistor groups 16 may be disposed between the two storage cells 14, so that the search transistor groups 16 do not need to be disposed between the adjacent storage cells 14 arranged in the second direction D2. Accordingly, portions of the insulating layer 18 located on both sides of the storage cells 14 may have the same width in the second direction D2. Specifically, the insulating layer 18 may include a first insulating block 18a and a second insulating block 18b. The first insulating block 18a is disposed on a side of the first active region AR1 opposite to the second active region AR2, and the second insulating block 18b is disposed on a side of the fourth active region AR4 opposite to the third active region AR3, and a width W1 of the first insulating block 18a in the second direction D2 is substantially the same as a width W2 of the second insulating block 18b in the second direction D2. Furthermore, the TCAM 1 may include a first TCAM bit cell 10A, a second TCAM bit cell 10B, and a third TCAM bit cell 10C sequentially arranged in the second direction D2. The first TCAM bit cell 10A and the second TCAM bit cell 10B adjacent to each other may be mirror-symmetrical to each other with respect to the extending direction of the active regions (e.g., the first direction D1), and the second TCAM bit cell 10B and the third TCAM bit cell 10C adjacent to each other may be mirror-symmetrical to each other with respect to the first direction D1. Therefore, a distance between the first active regions AR1 in the first TCAM bit cell 10A and the second TCAM bit cell 10B may be defined as the width W1 of the first insulating block 18a in the second direction D2, and a distance between the fourth active regions AR4 in the second TCAM bit cell 10B and the third TCAM bit cell 10C may be defined as the width W2 of the second insulating block 18b in the second direction D2. Since the width W1 and the width W2 may be substantially the same as each other, the difference between the transistor characteristics of the first pull-down transistor PD1 and the second pull-down transistor PD1 and the difference between the transistor characteristics of the first pass-gate transistor PG1 and the second pass-gate transistor PG2 may be mitigated, thereby improving the read operation and bit error rate of the TCAM 1. In one TCAM bit cell 10 of some embodiments, the storage cells 14 may be disposed between two search transistor groups 16, but is not limited to this. In some embodiments, the first active region AR1 of the two basic units 12 may be connected to each other to form a single active region, and the fourth active region AR4 may also be connected to each other to form another single active region.

Figure 4:
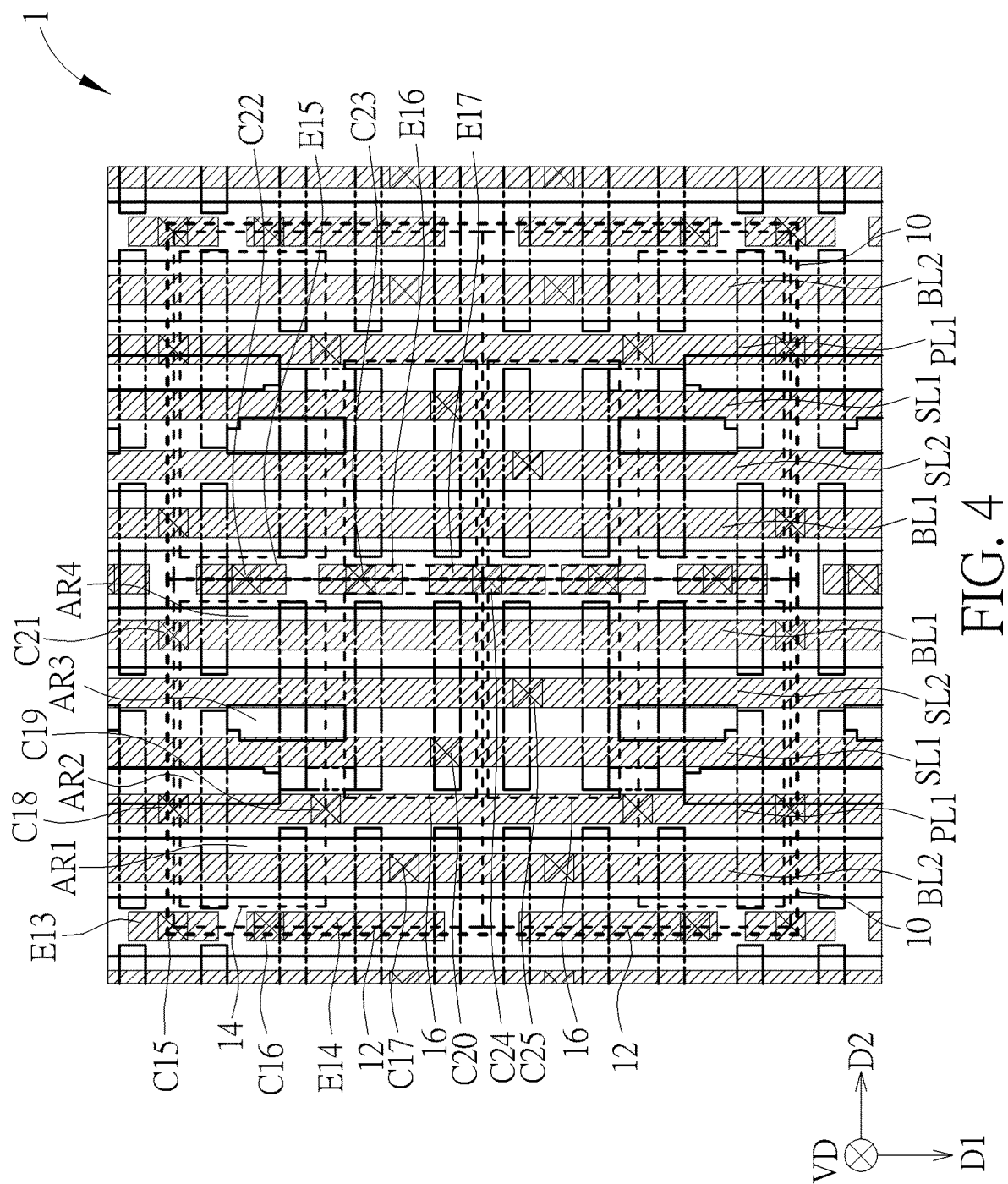
FIG. 4 schematically illustrates a top view of the active regions, the gate lines, a second contact layer, and a second metal layer of the TCAM according to an embodiment of the present invention.
Figure 5:
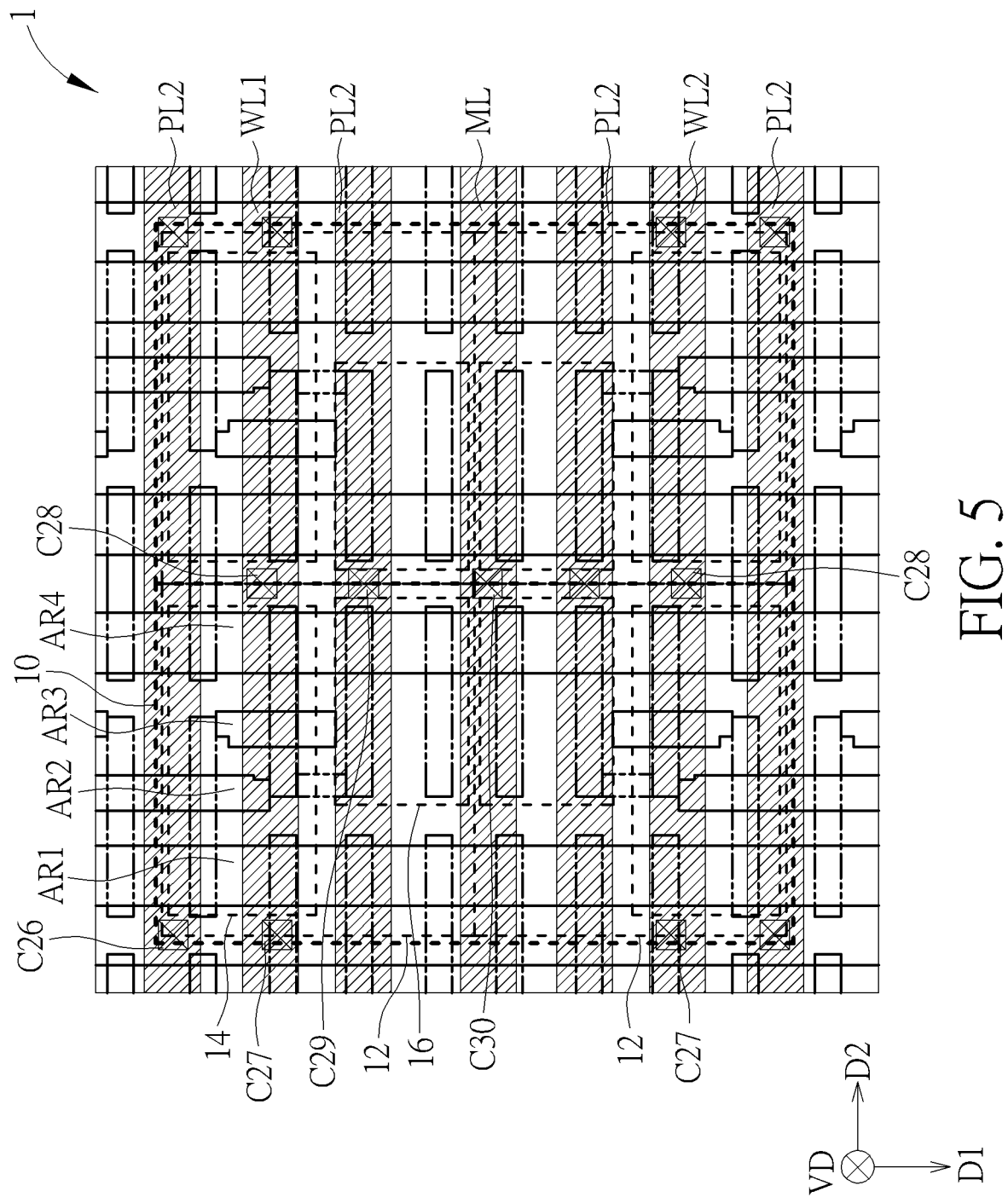
FIG. 5 schematically illustrates a top view of the active regions, the gate lines, a third contact layer, and a third metal layer of the TCAM according to an embodiment of the present invention.

Refer to FIG. 4 and FIG. 5 together with FIG. 2 and FIG. 3. FIG. 4 schematically illustrates a top view of the active regions, the gate lines, a second contact layer, and a second metal layer of the TCAM according to an embodiment of the present invention, and FIG. 5 schematically illustrates a top view of the active regions, the gate lines, a third contact layer, and a third metal layer of the TCAM according to an embodiment of the present invention. In order to clearly illustrate a layout structure of the second contact layer and the second metal layer and a layout structure of the third contact layer and the third metal layer, FIG. 4 just shows the active regions, the gate lines, the second contact layer and the second metal layer, and FIG. 5 just shows the active regions, the gate lines, the third contact layer and the third metal layer. The active regions and the gate lines in FIG. 4 and FIG. 5 may be the same as the active regions and the gate lines shown in FIG. 3, and symbols of the corresponding transistors and gate lines are omitted in FIG. 4 and FIG. 5, but not limited thereto. Moreover, another insulating layer may be provided between the second metal layer and the first metal layer, and another insulating layer may be provided between the third metal layer and the second metal layer, but are not limited to this. As shown in FIG. 4, the TCAM 1 may further include a second contact layer and a second metal layer sequentially disposed on the first metal layer shown in FIG. 3. The second contact layer may include contact plugs C15-C24, and the second metal layer may include bit lines BL1, BL2, first voltage source lines PL1, search lines SL1, SL2, and electrodes E13-E17, respectively extending along the first direction D1. In this embodiment, the bit line BL2, the first voltage source line PL1, the search line SL1, the search line SL2, and the bit line BL1 corresponding to the same TCAM bit cell 10 may be sequentially arranged along the second direction D2, but not limited thereto. The second contact layer may include a suitable conductive material, such as tungsten or copper. The second metal layer may include a suitable conductive material, such as aluminum, copper, or tungsten, but the present invention is not limited thereto.

As shown in FIG. 2 and FIG. 4, in this embodiment, the contact plug C15 may be disposed on the electrode E2, and the electrode E13 may be disposed on the contact plug C15, such that the contact plug C15 and the electrode E13 are electrically connected to the source/drain of the second pull-down transistor PD2. The contact plug C16 may be disposed on the electrode E1, and the electrode E14 may be disposed on the contact plug C16, such that the contact plug C16 and the electrode E14 are electrically connected to the third gate line GL3 (i.e., the gate of the second pass-gate transistor PG2). The contact plug C17 may be disposed on the electrode E4, and the bit line BL2 may be disposed on the contact plug C17, such that the bit line BL2 may be electrically connected to the source/drain of the second pass-gate transistor PG2. The contact plug C18 may be disposed on the electrode E5, the contact plug C19 may be disposed on the electrode E6, and the first voltage source line PL1 is disposed on the contact plugs C18, C19, such that the source/drains of the second pull-up transistor PU2 and the first the pull-up transistor PU1 may be electrically connected to the first voltage source by the first voltage source line PL1. The contact plug C20 may be disposed on the electrode E11, and the search line SL1 may be disposed on the contact plug C20, such that the search line SL1 may be electrically connected to the sixth gate line GL6 (i.e., the gate of the second search transistor 16b). The contact plug C25 may be disposed on the electrode E11 of another basic unit 12, and the search line SL2 may be disposed on the contact plug C25, such that the search line SL2 may be electrically connected to the gate of the second search transistor 16b of the another basic unit 12. The contact plug C21 is disposed on the electrode E8, and the bit line BL1 is disposed on the contact plug C21, such that the bit line BL1 may be electrically connected to the source/drain of the first pass-gate transistor PG1. The contact plug C22 is disposed on the electrode E10, and the electrode E15 is disposed on the contact plug C22, such that the contact plug C22 and the electrode E15 are electrically connected to the second gate line GL2 (i.e., the gate of the first pass-gate transistor PG1). The contact plug C23 is disposed on the electrode E9, and the electrode E16 is disposed on the contact plug C23, such that the contact plug C23 and the electrode E16 are electrically connected to the source/drain of the first pull-down transistor PD1. The contact plug C24 is disposed on the electrode E12, and the electrode E17 is disposed on the contact plug C24, such that the contact plug C24 and the electrode E17 are electrically connected to the drain/source of the second search transistor 16b.

As shown in FIG. 5, the TCAM 1 may further include a third contact layer and a third metal layer sequentially disposed on the second metal layer shown in FIG. 4. The third contact layer may include contact plugs C26-C30, and the third metal layer may include the second voltage source line PL2, the word lines WL1, WL2, and the match line ML, in which the second voltage source line PL2, the word line WL1, the word line WL2 and the match line ML respectively extend along the second direction D2 and cross the first active region AR1 and the fourth active region AR4 in the top view direction VD. In this embodiment, the second voltage source line PL2, the word line WL1, the second voltage source line PL2, the match line ML, the second voltage source line PL2, the word line WL2, and the second voltage source line PL2 corresponding to the same TCAM bit cell 10 may be sequentially arranged along the first direction D1, but not limited to this. The third contact layer may include a suitable conductive material, such as tungsten or copper. The third metal layer may include a suitable conductive material, such as aluminum, copper, or tungsten, but the present invention is not limited thereto.

As shown in FIG. 4 and FIG. 5, in this embodiment, the contact plug C26 is disposed on the electrode E13, and the second voltage source line PL2 is disposed on the contact plug C26, such that the source/drain of the second pull-down transistor PD2 may be electrically connected to the second voltage source (e.g., the second voltage source PW shown in FIG. 1) through the second voltage source line PL2 and the electrode E13. In one of the basic units 12, the contact plug C27 is disposed on the electrode E14, the contact plug C28 is disposed on the electrode E15, and the word line WL1 is disposed on the contact plugs C27, C28, so that the word line WL1 may be electrically connected to both the third gate line GL3 (i.e., the gate of the second pass-gate transistor PG2) and the second gate line GL2 (i.e., the gate of the first pass-gate transistor PG1) through the electrodes E14, E15.

In another basic unit 12, the word line WL2 may be disposed on other contact plugs C27, C28. The contact plug C29 is disposed on the electrode E16, and the second voltage source line PL2 is disposed on the contact plug C29, such that the source/drain of the first pull-down transistor PD1 may be electrically connected to the second voltage source (e.g., the second voltage source PW shown in FIG. 1) through the second voltage source line PL2 and the electrode E16. The contact plug C30 is disposed on the electrode E17, and the match line ML is disposed on the contact plug C30, such that the match line ML may be electrically connected to the drain/source of the second search transistor 16b through the electrode E17.

The layout structure of the basic unit of the present invention may be applied to other types of electronic devices, and is not limited to the foregoing embodiment. The basic unit applied to two-port SRAM is taken as an example in following description, but not limited to thereto. In order to compare different embodiments and simplify the description, same elements will be labeled with same symbols below. The following description will detail differences between the different embodiments, and same features will not be repeated.

Figure 6:
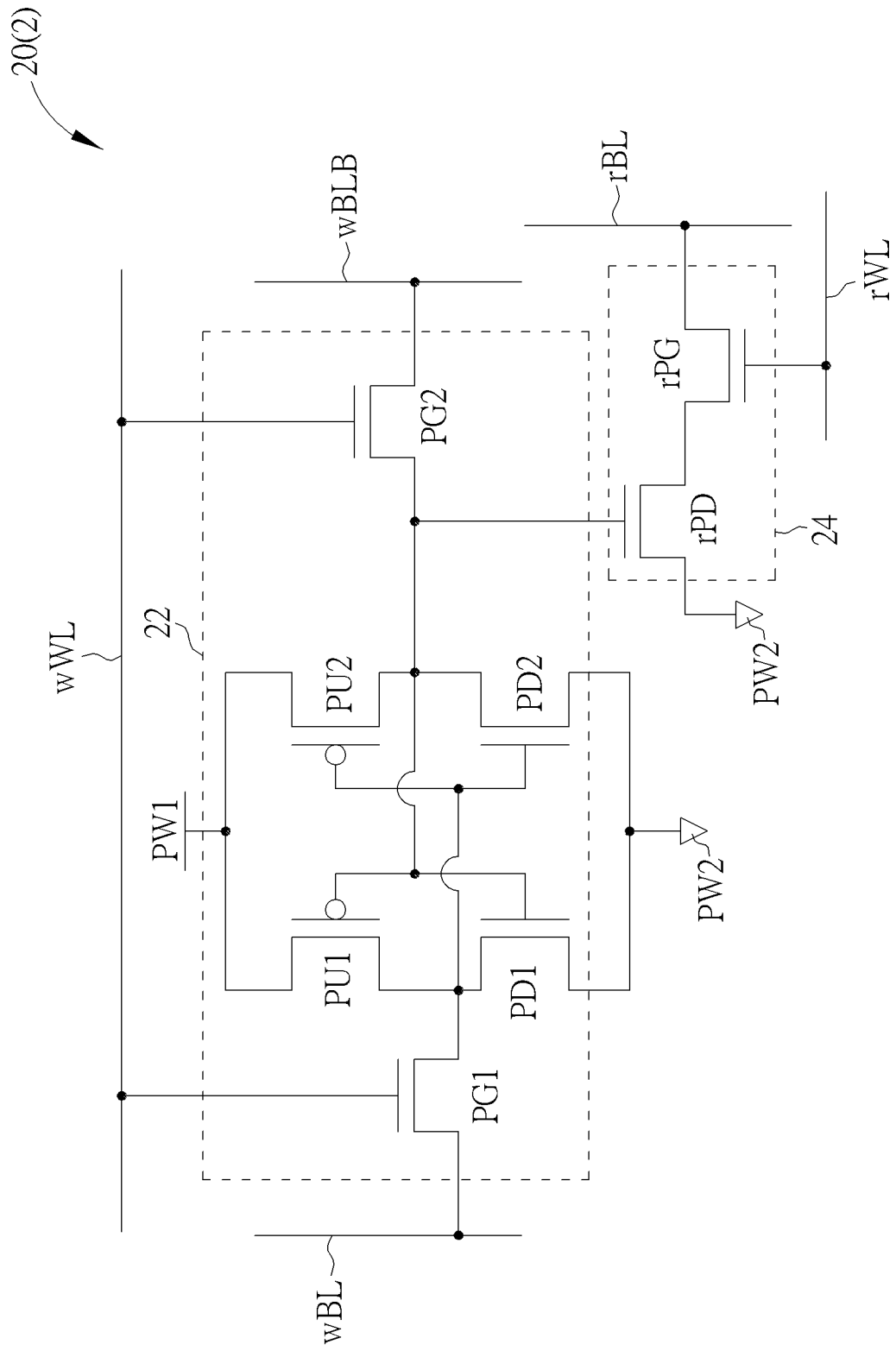
FIG. 6 schematically illustrates a circuit diagram of a two-port static-random access memory (SRAM) according to an embodiment of the present invention.

Refer to FIG. 6, which schematically illustrates a circuit diagram of a two-port static-random access memory (SRAM) according to an embodiment of the present invention. As shown in FIG. 6, the two-port SRAM 2 may include a SRAM cell 20. For clarity, FIG. 6 just shows a single SRAM cell 20, but not limited thereto. Specifically, the SRAM cell 20 may include a storage cell 22 and a read-port transistor group 24. The storage cell 22 may be similar or the same as the storage cell 14 of the above-mentioned TCAM, so that the storage cell 22 may include a first pull-up transistor PU1, a first pull-down transistor PD1, the second pull-up transistor PU2, the second pull-down transistor PD2, the first pass-gate transistor PG1, and the second pass-gate transistor PG2, and electrical connection between them may be the same as that of the storage cell 14 shown in FIG. 1 and will not be detailed redundantly herein. As shown in FIG. 6, the source/drains of the first pull-up transistor PU1 and the second pull-up transistor PU2 may be electrically connected to each other and electrically connected to the first voltage source PW1, and the source/drains of the first pull-down transistor PD1 and the second pull-down transistor PD2 may be electrically connected to each other and electrically connected to the second voltage source PW2. The gates of the first pass-gate transistor PG1 and the second pass-gate transistor PG2 may be electrically connected to the same word line wWL, and the source/drain of the first pass-gate transistor PG1 and the source/drain of the second pass-gate transistor PG2 may be electrically connected to the bit line wBL and the bit line wBLB, respectively, where the word line wWL may be, for example, a write word line, and the bit line wBL and the bit line wBLB may be, for example, write bit lines, but not limited thereto. The bit line wBL and the bit line wBLB may, for example, be used to transmit inverted or complementary signals.

In addition, in the embodiment of FIG. 6, the read-port transistor group 24 may include a first read-port transistor rPD and a second read-port transistor rPG, in which a gate, a drain/source, and a source/drain of the first read-port transistor rPD may be electrically connected to the drain/source of the second pass-gate transistor PG2, the second voltage source PW2, and a drain/source of the second read-port transistor rPG, and a gate and a source/drain of the second read-port transistor rPD may be electrically connected to the corresponding bit line rBL and word line rWL, respectively. The bit line rBL and the word line rWL may be, for example, a read bit line and a read word line, respectively, but are not limited thereto. The electrical connection of the first read-port transistor rPD and the second read-port transistor rPG shown in FIG. 6 may be the same or similar to the electrical connection of the first search transistor 16a and the second search transistor 16b shown in FIG. 1 and will not be detailed redundantly.

Figure 7:
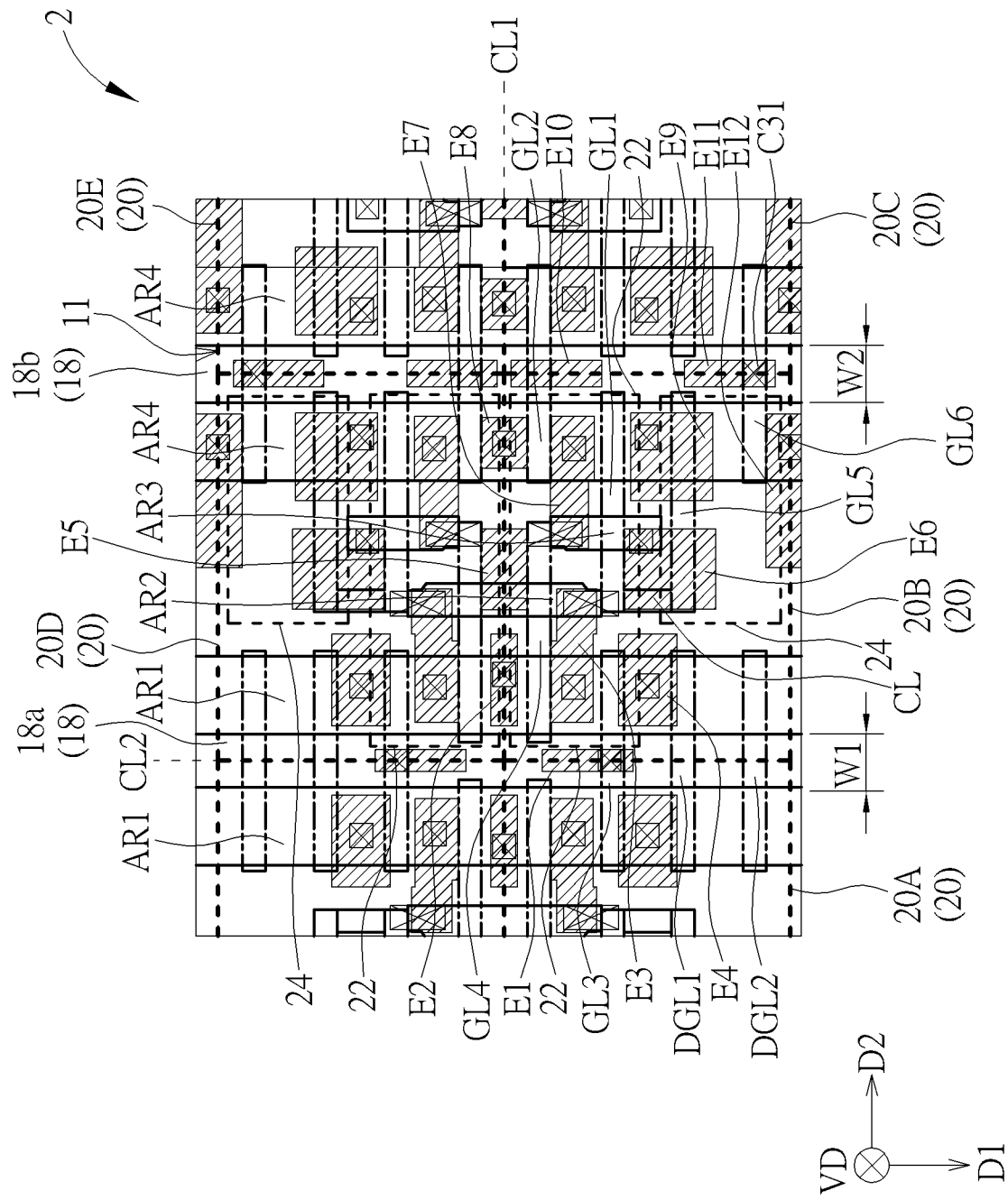
FIG. 7 schematically illustrates a top view of active regions, gate lines, a first contact layer, and a first metal layer of the two-port SRAM according to an embodiment of the present invention.
Figure 8:
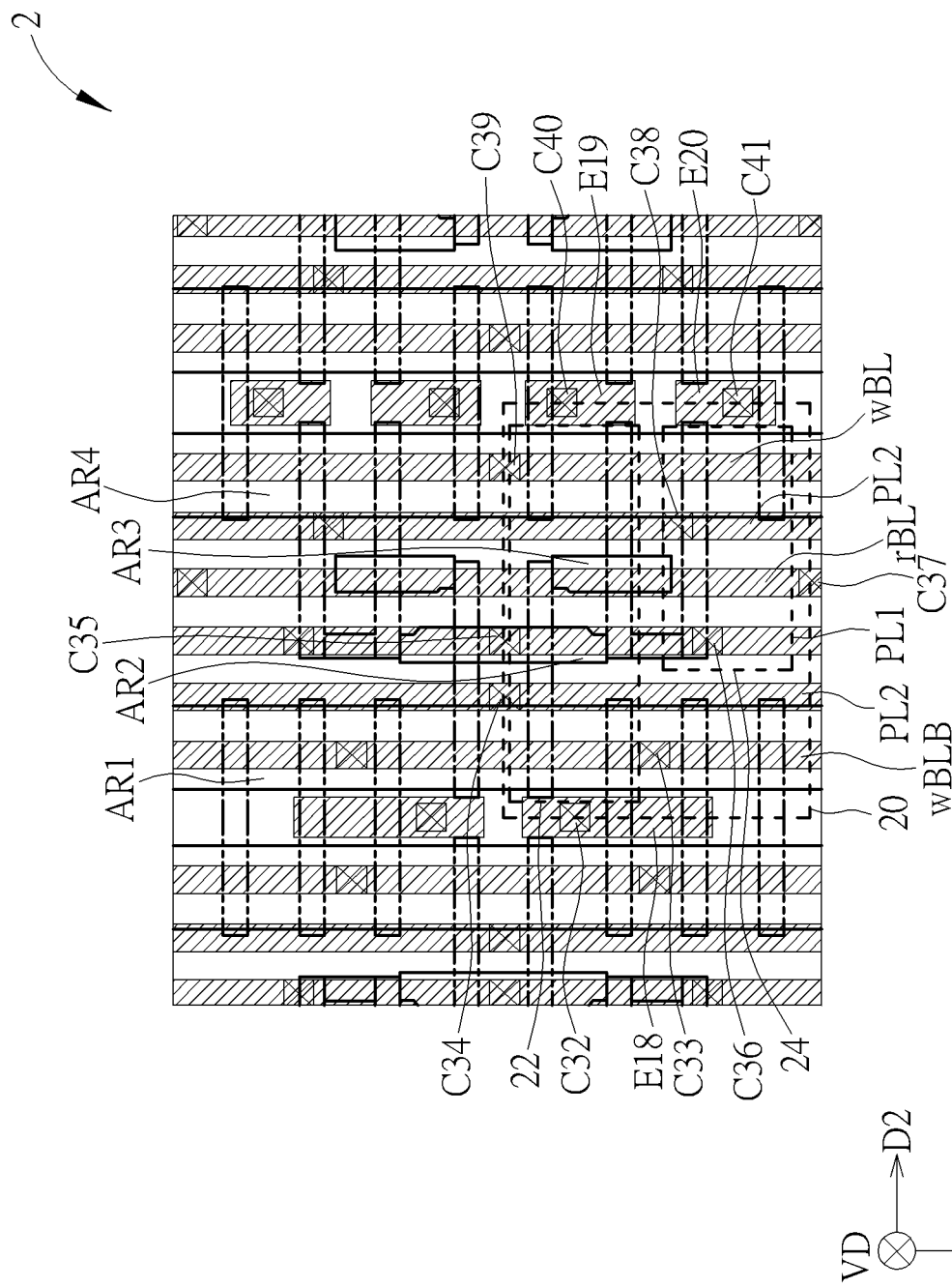
FIG. 8 schematically illustrates a top view of the active regions, the gate lines, a second contact layer, and a second metal layer of the two-port SRAM according to an embodiment of the invention.
Figure 9:
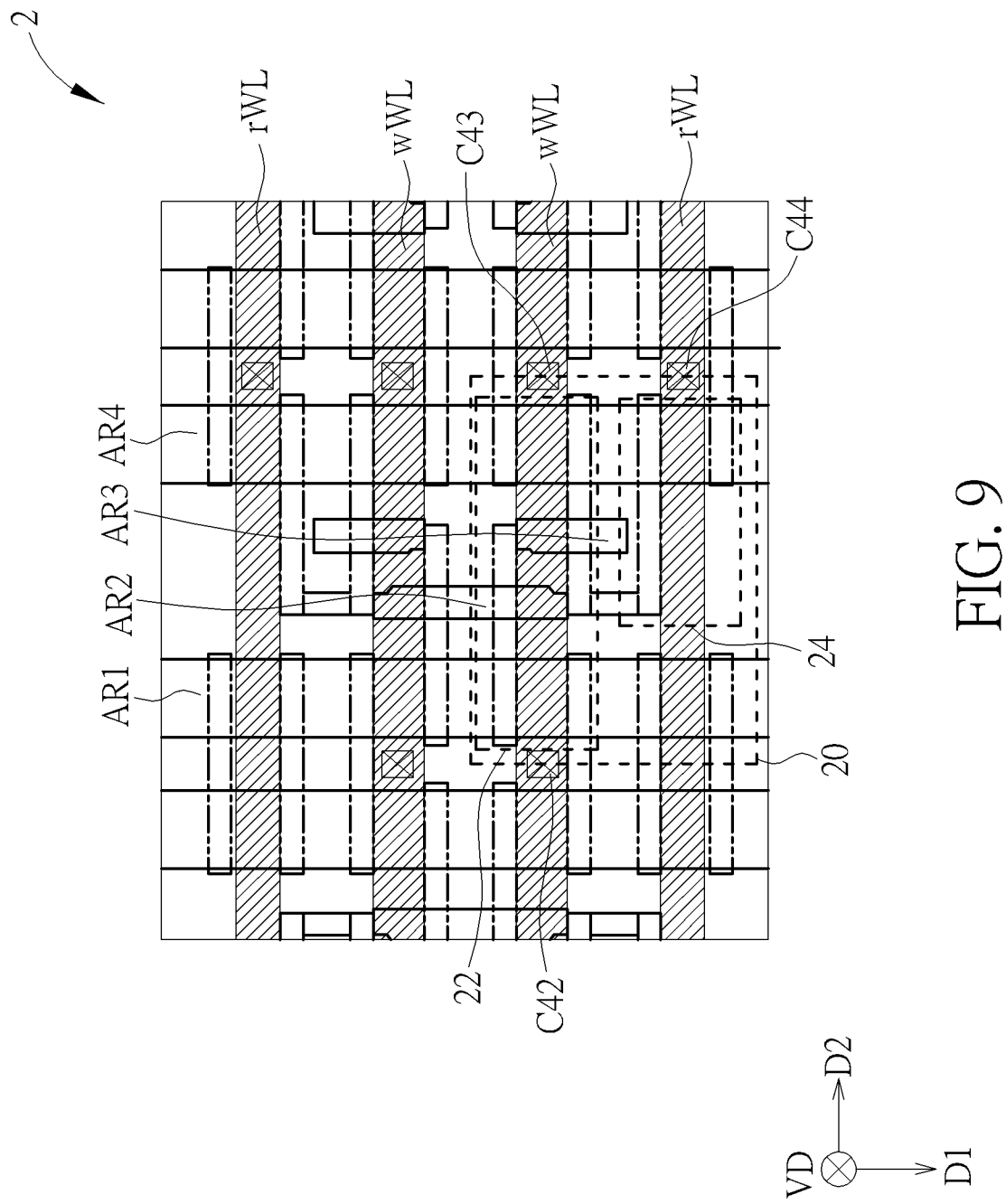
FIG. 9 schematically illustrates the active regions, the gate lines, a third contact layer, and a third metal layer of the two-port SRAM according to an embodiment of the invention.

Refer to FIG. 7-FIG. 9. FIG. 7 schematically illustrates a top view of active regions, gate lines, a first contact layer, and a first metal layer of the two-port SRAM according to an embodiment of the present invention, FIG. 8 schematically illustrates a top view of the active regions, the gate lines, a second contact layer, and a second metal layer of the two-port SRAM according to an embodiment of the invention, and FIG. 9 schematically illustrates the active regions, the gate lines, a third contact layer, and a third metal layer of the two-port SRAM according to an embodiment of the invention. To clearly illustrate a layout structure of the first contact layer and the first metal layer, a layout structure of the second contact layer and the second metal layer, and a layout structure of the third contact layer and the third metal layer, FIG. 7 just shows the active regions, the gate lines, the first contact layer and the first metal layer, FIG. 8 just shows the active regions, the gate lines, the second contact layer and the second metal layer, and FIG. 9 just shows the active regions, the gate lines, and the third contact layer and the third metal layer. Also, insulating layers may be respectively provided between the first metal layer and the active regions and the gate lines, between the second metal layer and the first metal layer, and between the third metal layer and the second metal layer, but not limited thereto. The SRAM cell 20 shown in FIG. 7 may be similar to the basic unit 12 shown in FIG. 2, so symbols of the corresponding transistors are omitted, but not limited thereto. The active regions and the gate lines shown in FIG. 8 and FIG. 9 may be the same as the active regions and the gate lines shown in FIG. 7, and the symbols of the corresponding transistors and gate lines are omitted in FIG. 8 and FIG. 9.

As shown in FIG. 7, the two-port SRAM 2 may include a plurality of SRAM cells 20, and the storage cell 22 of one SRAM cell 20 (such as the SRAM cell 20B) may have substantially the same structure as the storage cell 14 shown in FIG. 2. Specifically, the storage cell 22 may include the first active region AR1, the second active region AR2, the third active region AR3, the fourth active region AR4, the first gate line GL1, the second gate line GL2, the third gate line GL3, and the fourth gate line GL4. Since the first active region AR1, the second active region AR2, the third active region AR3, the fourth active region AR4, the first gate line GL1, the second gate line GL2, the third gate line GL3, and the fourth gate line GL4 may form the first pull-up transistor PU1, the first pull-down transistor PD1, the second pull-up transistor PU2, the second pull-down transistor PD2, the first pass-gate transistor PG1, and the second pass-gate transistor PG2 shown in FIG. 6 may be the same as the embodiment shown in FIG. 2, so they will not be repeated herein.

In addition, as shown in FIG. 7, the read-port transistor group 24 of the SRAM cell 20 may be substantially similar to or the same as the search transistor group 16 shown in FIG. 2, so the read-port transistor group 24 may include the fifth gate line GL5 and the sixth gate line GL6 crossing the fourth active region AR4 to form the first read-port transistor rPD and the second read-port transistor rPG shown in FIG. 6. The drain/source of the first read-port transistor rPD and the source/drain of the second read-port transistor rPG may be disposed in the same fourth active region AR4, for example, may be formed of the same doped region, so that the source/drains and drain/sources of the first read-port transistor rPD, the second read-port transistor rPG, the first pull-down transistor PD1, and the first pass-gate transistor PG1 may be disposed in the same fourth active region AR4. Accordingly, the storage cell 22, the first read-port transistor rPD, and the second read-port transistor rPG may be arranged along the extending direction of the active regions (e.g., the first direction D1).

The fifth gate line GL5 of this embodiment may have substantially the same structure as the fifth gate line GL5 of FIG. 2, so that the fifth gate line GL5 may be electrically connected to the first gate line GL1. The SRAM cell 20 may further include the connection line CL connected between the first gate line GL1 and the fifth gate line GL5. For example, the connection line CL may be connected to the first gate line GL1 and the fifth gate line GL5 to form a monolithic C-shaped gate structure, but not limited thereto. In some embodiments, the first gate line GL1 and the fifth gate line GL5 are symmetrical to each other with respect to the second direction D2. In the embodiment of FIG. 7, a difference between the read-port transistor group 24 and the search transistor group 16 of FIG. 2 is that the sixth gate line GL6 of this embodiment may be asymmetrical to the fifth gate line GL5. Specifically, a length of the sixth gate line GL6 in the second direction D2 of this embodiment may be less than a length of the fifth gate line GL5 in the second direction D2, but not limited thereto.

In some embodiments, as shown in FIG. 7, the SRAM cell 20 may optionally further include two dummy gate lines DGL1 and DGL2 arranged in the first direction D1. Since the dummy gate lines DGL1 and DGL2 have the same functions as the dummy gate lines DGL1 and DGL2 shown in FIG. 2, they will not be repeated herein.

As shown in FIG. 7, the two-port SRAM 2 may include a plurality of SRAM cells 20, and structures of the adjacent SRAM cells 20 arranged in the first direction D1 may be mirror-symmetrical to each other with respect to the extending direction of the gate lines (e.g., the second direction D2). For example, the structures of two adjacent SRAM cells 20 may be symmetrical to each other with respect to a center line CL1 located between two adjacent fourth gate lines GL4 and spaced apart from the two fourth gate lines GL4 by the same distance. The structures of two adjacent SRAM cells 20 arranged in the second direction D2 may be mirror-symmetrical to each other with respect to the extending direction of the active regions (e.g., the first direction D1). Accordingly, the structure of each SRAM cell 20 may be obtained, and will not be detailed redundantly. For example, the structures of two adjacent SRAM cells 20 arranged in the second direction D2 may be symmetrical to each other with respect to a center line CL2 located between two adjacent first active regions AR1 or two adjacent fourth active regions AR4 and spaced apart from the two adjacent first active regions AR4 or the two adjacent fourth active regions AR4 by the same distance.

In the embodiment of FIG. 7, in the adjacent SRAM cells 20 arranged in the first direction D1, the storage cells 22 may be disposed between two read-port transistor groups 24, so that the read-port transistor groups 24 do not need to be disposed between the storage cells 22 arranged in the second direction D2. Accordingly, portions of the insulating layers 18 located on both sides of the storage cell 22 may have the same width in the second direction D2. Specifically, the insulating layer 18 may include a first insulating block 18a and a second insulating block 18b. The first insulating block 18a is disposed on a side of the first active region AR1 opposite to the second active region AR2, the second insulating block 18b is disposed on a side of the fourth active region AR4 opposite to the third active region AR3, and the width W1 of the first insulating block 18a in the second direction D2 is substantially the same as the width W2 of the second insulating block 18b in the second direction D2. In other words, the two-port SRAM 2 may include a first SRAM cell 20A, a second SRAM cell 20B, and a third SRAM cell 20C sequentially arranged in the second direction D2. A distance between the first active regions AR1 of the first SRAM cell 20A and the second SRAM cell 20B may be defined as the width W1 of the first insulating block 18a in the second direction D2, and a distance between the fourth active regions AR4 of the second SRAM cell 20B and the third SRAM cell 20C may be defined as the width W2 of the second insulating block 18b in the second direction D2. Since the width W1 and the width W2 may be designed to be substantially the same as each other without considering the reading transistor groups 24, a difference between transistor characteristics of the first pull-down transistor PD1 and the second pull-down transistor PD2 and a difference between transistor characteristics of the first pass-gate transistor PG1 and the second pass-gate transistor PG2 may be mitigated, thereby improving the read operation of the TCAM 1 and reducing bit error rate of the TCAM 1. In some embodiments, the read-port transistor group 24 may be disposed between the two storage cells 22, but it is not limited thereto. In some embodiments, as shown in FIG. 7, four adjacent SRAM cells 20 arranged in a matrix (such as SRAM cells 20B, 20C, 20D, 20E) may form a repeating structure 11, and the two-port SRAM 2 may include a plurality of repeating structures 11, wherein the repeating structures 11 may have the same structure, and the repeating structures 11 with the same orientation are arranged in an array.

As shown in FIG. 7, the two-port SRAM 2 of this embodiment may include the first contact layer and the first metal layer sequentially disposed on the active regions and the gate lines. It should be noted that the contact plugs of the first contact layer of this embodiment are similar to the contact plugs of the first contact layer shown in FIG. 2, the same contact plugs will not be described again, and the difference between the first contact layer of this embodiment and the first contact layer of FIG. 2 is that in this embodiment, the contact plug C31 disposed on the sixth gate line GL6 is disposed on a side of the fourth active region AR4 opposite to the first active region AR1 in the top view direction VD, but the present invention is not limited thereto. In addition, the first metal layer of this embodiment may also include electrodes E1-E12, and the electrical connection of the electrodes E1-E12 to the storage cell 22 and the read-port transistor group 24 may be similar to the electrodes E1-E12 shown in FIG. 2, so they will not be detailed again.

Furthermore, as shown in FIG. 8, the two-port SRAM 2 may further include a second contact layer and a second metal layer sequentially disposed on the first metal layer of FIG. 7. The second contact layer may include contact plugs C32-C40, and the second metal layer corresponding to the same SRAM cell 20 may include three bit lines wBLB, wBL, rBL, two second voltage source lines PL2, a first voltage source line PL1 and electrodes E18-E20 respectively extend along the first direction D1. In this embodiment, the bit line wBLB, one of the second voltage source lines PL2, the first voltage source line PL1, the bit line rBL, another of the second voltage source lines PL2, and the bit line wBL corresponding to the same SRAM cell 20 may be sequentially arranged along the second direction D2, but not limited thereto.

As shown in FIG. 7 and FIG. 8, in this embodiment, the contact plug C32 may be disposed on the electrode E1, and the electrode E18 may be disposed on the contact plug C32, such that the contact plug C32 and the electrode El8 may be electrically connected to the third gate line GL3 (i.e., the gate of the second pass-gate transistor). The contact plug C33 may be disposed on the electrode E4, and the bit line wBLB may be disposed on the contact plug C17, so that the bit line wBLB may be electrically connected to the source/drain of the second pass-gate transistor. The contact plug C34 may be disposed on the electrode E2, and the second voltage source line PL2 may be disposed on the contact plug C34, so that the source/drain of the second pull-down transistor may be electrically connected to the second voltage source (e.g., the second voltage source PW2 shown in FIG. 6) through the second voltage source line PL2. The contact plug C35 may be disposed on the electrode E5, the contact plug C36 may be disposed on the electrode E6, and the first voltage source line PL1 may be disposed on the contact plugs C35, C36, so that the source/drains of the second pull-up transistor PU2 and the first pull-up transistor PU1 may be electrically connected to the first voltage source (e.g., the first voltage source PW1 shown in FIG. 6) through the first voltage source line PL1. The contact plug C37 may be disposed on the electrode E12, and the bit line rBL may be disposed on the contact plug C37, so that the bit line rBL may be electrically connected to the drain/source of the second read-port transistor. The contact plug C38 may be disposed on the electrode E9, and the second voltage source line PL2 is disposed on the contact plug C38, so that the source/drain of the first pull-down transistor may be electrically connected to the second voltage source line PL2 (the second voltage source PW2 shown in FIG. 6). The contact plug C39 may be disposed on the electrode E8, and the bit line wBL may be disposed on the contact plug C39, so that the bit line wBL may be electrically connected to the source/drain of the first pass-gate transistor. The contact plug C40 may be disposed on the electrode E10, and the electrode E19 is disposed on the contact plug C40, so that the contact plug C40 and the electrode E19 may be electrically connected to the second gate line GL2 (i.e., the gate of the first pass-gate transistor PG1). The contact plug C41 may be disposed on the electrode E11, and the electrode E20 may be disposed on the contact plug C41, so that the electrode E20 may be electrically connected to the sixth gate line GL6 (i.e., the gate of the second read-port transistor).

As shown in FIG. 9, the two-port SRAM 2 may further include a third contact layer and a third metal layer sequentially arranged on the second metal layer shown in FIG. 8. The third contact layer may include contact plugs C42-C44, and the third metal layer may include word lines wWL, rWL extending along the second direction D2 and crossing the first active region AR1 and the fourth active region AR4. The word line wWL and the word line rWL corresponding to the same SRAM cell 20 may be sequentially arranged along the first direction D1, but not limited thereto.

As shown in FIG. 8 and FIG. 9, the contact plug C42 may be disposed on the electrode E18, the contact plug C43 may be disposed on the electrode E19, and the word line wWL is disposed on the contact plug C42 and the contact plug C43, so that the third gate line GL3 (i.e., the gate of the second pass-gate transistor) and the second gate line GL2 (i.e., the gate of the first pass-gate transistor) may be electrically connected to the word line wWL. The contact plug C44 may be disposed on the electrode E20, and the word line rWL may be disposed on the contact plug C44, so that the word line rWL may be electrically connected to the sixth gate line GL6 (i.e., the gate of the second read-port transistor).

In summary, in the TCAM and the two-port SRAM of the present invention, the storage cell and the search transistor group or the read-port transistor group may be arranged in the extending direction of the active region, such that the width of a portion of the insulating layer located on a side of the fourth active region of the storage cell opposite to the third active region in the extending direction of the gate line may be designed to be the same as the width of another portion of the insulating layer located on a side of the first active region opposite to the second active region in the extending direction of the gate line without considering the search transistor group. Accordingly, the difference between the transistor characteristics of the first pull-down transistor and the second pull-down transistor and the difference between the transistor characteristics of the first pass-gate transistor and the second pass-gate transistor may be mitigated, thereby improving the read operation of the TCAM and the two-port SRAM and reducing the bit error rate of the TCAM and the two-port SRAM.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A ternary content addressable memory (TCAM), comprising:
    a storage cell, comprising:
        a first active region extending along a first direction;
        a second active region extending along the first direction;
        a third active region extending along the first direction;
        a fourth active region extending along the first direction, wherein the first active region, the second active region, the third active region, and the fourth active region are sequentially arranged along a second direction;
        a first gate line crossing the third active region and the fourth active region and extending along the second direction;
        a second gate line crossing the fourth active region and extending along the second direction;
        a third gate line crossing the first active region and extending along the second direction; and
        a fourth gate line crossing the first active region and the second active region and extending along the second direction; and
    two search transistors electrically connected to the storage cell, wherein the storage cell and a whole of the two search transistors are arranged along the first direction.

2. The TCAM according to claim 1, further comprising a first insulation block and a second insulation block, the first insulation block being disposed on a side of the first active region opposite to the second active region, and the second insulation block being disposed on a side of the fourth active region opposite to the third active region, wherein a width of the first insulation block in the second direction is the same as a width of the second insulation block in the second direction.

3. The TCAM according to claim 1, wherein source/drains and drain/sources of the two search transistors are disposed in the fourth active region.

4. The TCAM according to claim 1, wherein the first gate line and the fourth gate line have a same length in the second direction.

5. The TCAM according to claim 1, further comprising another storage cell, wherein the storage cell and the another storage cell are arranged along the first direction, and the two search transistors are disposed between the storage cell and the another storage cell.

6. The TCAM according to claim 1, wherein one of the two search transistors comprises a fifth gate line crossing the fourth active region.

7. The TCAM according to claim 6, wherein the first gate line and the fifth gate line are symmetrical to each other with respect to the second direction.

8. The TCAM according to claim 6, further comprising a connection line connected between the first gate line and the fifth gate line.

9. The TCAM according to claim 1, wherein one of the two search transistors comprises a sixth gate line crossing the fourth active region.

10. The TCAM according to claim 1, further comprising two dummy gate lines crossing the first active region.

11. A two-port static random access memory (SRAM), comprising:
    a storage cell, comprising:
        a first active region extending along a first direction;
        a second active region extending along the first direction;
        a third active region extending along the first direction;
        a fourth active region extending along the first direction, wherein the first active region, the second active region, the third active region, and the fourth active region are sequentially arranged along a second direction;
        a first gate line crossing the third active region and the fourth active region and extending along the second direction;
        a second gate line crossing the fourth active region and extending along the second direction;
        a third gate line crossing the first active region and extending along the second direction; and
        a fourth gate line crossing the first active region and the second active region and extending along the second direction; and
    two read-port transistors electrically connected to the storage cell, wherein the storage cell and a whole of the two read-port transistors are arranged along the first direction.

12. The two-port SRAM according to claim 11, further comprising a first insulation block and a second insulation block, the first insulation block being disposed on a side of the first active region opposite to the second active region, and the second insulation block being disposed on a side of the fourth active region opposite to the third active region, wherein a width of the first insulation block in the second direction is the same as a width of the second insulation block in the second direction.

13. The two-port SRAM according to claim 11, wherein source/drains and drain/sources of the two read-port transistors are disposed in the fourth active region.

14. The two-port SRAM according to claim 11, wherein the first gate line and the fourth gate line have a same length in the second direction.

15. The two-port SRAM according to claim 11, further comprising another storage cell, wherein the storage cell and the another storage cell are arranged along the first direction, and the two read-port transistors are disposed between the storage cell and the another storage cell.

16. The two-port SRAM according to claim 11, wherein one of the two read-port transistors comprises a fifth gate line crossing the fourth active region.

17. The two-port SRAM according to claim 16, wherein the first gate line and the fifth gate line are symmetrical to each other with respect to the second direction.

18. The two-port SRAM according to claim 16, further comprising a connection line connected between the first gate line and the fifth gate line.

19. The two-port SRAM according to claim 11, wherein one of the two read-port transistors comprises a sixth gate line crossing the fourth active region.

20. The two-port SRAM according to claim 11, further comprising two dummy gate lines crossing the first active region.

* * * * *